United States Patent [19]

Young

[11] Patent Number: 4,814,649

[45] Date of Patent: Mar. 21, 1989

[54] DUAL GATE FET MIXING APPARATUS WITH FEEDBACK MEANS

[75] Inventor: James P. Young, Cedar Rapids, Iowa

[73] Assignee: Rockwell International Corporation, El Segundo, Calif.

[21] Appl. No.: 134,656

[22] Filed: Dec. 18, 1987

[51] Int. Cl.$^4$ .................... H03B 19/00; H03K 3/353
[52] U.S. Cl. .................. 307/529; 307/219.1; 307/304; 328/15; 455/333
[58] Field of Search ............ 307/529, 219.1, 304; 328/14, 15, 158, 20, 160; 330/277, 69, 290, 291; 331/116 FE, 117 FE; 455/332, 333

[56] References Cited

U.S. PATENT DOCUMENTS

| | | | |
|---|---|---|---|
| 4,112,373 | 9/1978 | Miyamoto | 455/333 X |
| 4,264,981 | 4/1982 | Vilimek | 455/333 |
| 4,308,473 | 12/1981 | Carnes | 307/529 |

FOREIGN PATENT DOCUMENTS 0017708  1/1984  Japan .................... 455/333

Primary Examiner—Stanley D. Miller
Assistant Examiner—Timothy P. Callahan
Attorney, Agent, or Firm—Bruce C. Lutz; V. Lawrence Sewell; H. Fredrick Hamann

[57] ABSTRACT

When a dual gate FET is used in a mixing type circuit, the non-linear characteristics of an over-driven gate on the FET is used to create the sum and difference of the gate applied signals at the drain of the FET. Although feedback typically is used to increase the linearity of a class A amplifier where a single gate FET is used, the feedback in the present circuit overcomes the problem of maintaining a stable operating point for the mixer circuit while not interfering with the performance of the FET as a mixer. Thus, with the feedback to the first gate, the sensitivity of the DC bias on the second gate is decreased and can be set with simple (wide tolerance) components.

2 Claims, 1 Drawing Sheet

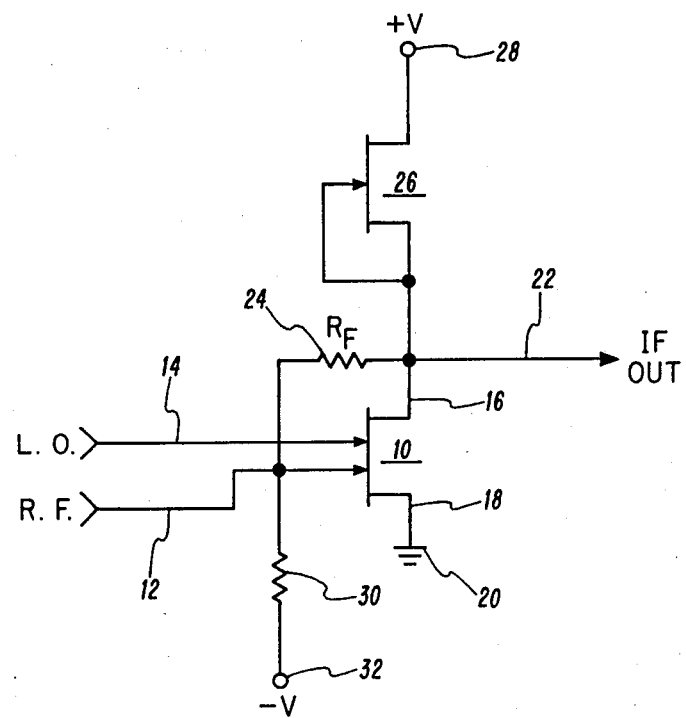

DUAL GATE FET MIXING APPARATUS WITH FEEDBACK MEANS

This invention was made with government support under Contract No. F29601-85-C-0022 awarded by the Department of the Navy. The government has certain rights in this invention.

THE INVENTION

The present invention is generally related to electronics and more specifically to improving the bias point stability of a dual gate FET used as a portion of a mixer circuit without decreasing the performance of the FET as a mixer.

BACKGROUND

As purchased, dual gate FETs vary in characteristics substantially unless they are purchased to an extremely tight characteristic tolerance. When solid state devices such as FETs are purchased to tight tolerances, the cost rises in accordance with the tightness of the tolerance. Thus, when less expensive FETs are purchased, the characteristics are such that the biasing points used to bias the gate on an FET must be adjusted for each individual circuit and readjusted whenever a new FET is inserted in place of a previous FET in a given circuit.

When an FET is used in a class A amplifier circuit where the objective is to have linear operation, feedback has been used from the drain to the gate to both stabilize the operating point of the FET and to linearize the output signal with respect to the input.

When an FET is used in a circuit where it is desired to mix two signals such as a local oscillator and an RF signal to obtain an intermediate frequency sum or difference signal, the basis of such mixing is in part related to the non-linear modulation of the FET channel due to the overdriving of the gate by the local oscillator signal. It is the non-linear characteristic of the FET which desirably causes the mixing action whereby the sum and difference of these two signals are created at the drain of the FET.

Since the non-linearity of the FET is a desirable characteristic when used as a mixer, one skilled in the art would assume that anything that would tend to reduce non-linearity, such as a feedback resistor, would diminish the performance of the FET in its mixing action. However, since the feedback is only applied to the gate receiving the RF input and is not applied to the gate receiving the signal which overdrives the gate, the operating point is stabilized with no measurable diminution of the mixing action as compared to prior art biasing techniques.

It is thus an object of the present invention to provide an improved mixing circuit from the standpoint of having a stable operating point while simultaneously reducing the complexity of the bias adjustment for the circuit with changes in FETs and their associated individual characteristics.

Other objects and advantages of the invention will be apparent from a reading of the specification and appended claims in conjunction with the single drawing which is a schematic diagram of a feedback biased dual gate FET configured as a mixer and receiving its power from a constant current source.

DETAILED DESCRIPTION

A dual gate FET 10 is illustrated having a first gate 12, a second gate 14, a drain 16 and a source 18. Source 18 is connected to ground or reference potential 20 while drain 16 is connected to an output lead 22. RF signals are supplied to the first gate 12 which is connected via a feedback resistor 24 to the drain lead 16. Local oscillator (L.O.) signals are supplied to the second gate 14. A second FET 26 is connected between a positive power potential 28 and the drain 16, and since its gate is connected to its source, FET 26 acts as a constant current source for the FET 10. The first gate 12 is connected through a resistor 30 to a negative power potential 32.

OPERATION

The understanding of the operation of the present circuit is reasonably straight-forward once it is ascertained that the feedback from the drain 16 to the first gate 12 does not diminish the performance of the device as a mixer. The FET 26 is connected in a manner such that it provides a constant current source to the mixer circuit including FET 10. The feedback resistor 24 operates in a manner similar to that for a single gate FET in a class A amplifier whereby the resistor 24 provides negative feedback. If the drain voltage increases, the feedback resistor causes the gate voltage to attempt to increase. Any increase in gate voltage increases the drain current and acts in a manner to attempt to reduce the drain voltage. Thus, there is a compensation for the attempted increase in drain voltage.

As previously mentioned, the second gate 14 is overdriven by the local oscillator signal so as to provide non-linear modulation of the FET channel. The non-linear characteristics of the FET thereby cause the RF and local oscillator signals to mix creating the sum and difference of these two signals in the drain 16 of the FET 10. Although the output lead 22 is labeled as IF only, this lead actually incorporates not only the sum and difference IF signals but also substantial components of both the RF and the local oscillator signals as well. Typically, however, one of the IF signals is filtered off and the local oscillator and RF signals are also filtered off to leave only a single IF signal at some point in the signal train.

The unobvious portion of the present inventive circuit is that since feedback typically increases the linearity of a device such as an FET and since non-linearity is the basis of operation of an FET as a good mixer, it would appear to one skilled in the art that by adding the feedback to a dual gate FET mixer that its performance as a mixer would diminish. In practice, however, this has proved not to be the case. Further, the bias at the second gate 14 is merely biased with simple components to a voltage which will create maximum conversion gain, and the feedback to the first gate decreases the sensitivity of the DC bias on the second gate so that the bias to the second gate does not need to be individually adjusted for each different FET such as FET 10.

The present invention thus eliminates potentiometers or variable voltage power supplies and the specific adjustments required in the prior art when changing FETs in a given circuit.

The mixer circuit provides its optimum operation when the current source to the drain includes an active element such as FET 26 to provide constant current, but a simple resistive current source would work for some circuit applications.

Although I have shown a specific embodiment of the circuit using a dual gate FET, I intend to be limited not by the specific circuit shown but only by the scope of the invention as claimed in the appended claims.

I claim:

1. Signal mixer apparatus comprising, in combination:
   dual gate FET first means including first and second gate means, source means and drain means;
   constant current source second means connected to said drain means of said first means;
   reference potential third means connected to said source means of said first means;
   feedback impedance fourth means connected between said drain means and said first gate means of said FET first means;
   signal source fifth means for supplying a first signal to be mixed to said first gate means of said FET first means;
   signal source sixth means for supplying a second signal to be mixed to said second gate means of said FET first means; and
   apparatus signal output seventh means, connected to said drain means of said first means, for outputting generated product signals.

2. Signal mixer apparatus comprising, in combination:
   dual gate signal mixing solid state first means including first and second gate means, coupled between reference potential second means and signal output third means, said first means introducing nonlinearities into resultant signals generated via a combination of signals applied to said first and second gate means and outputting same at said signal output third means;
   current source fourth means connected to said signal output third means of said first means;
   feedback impedance fifth means connected between said signal output third means and said first gate means of said solid state first means;
   signal source sixth means for supplying a first signal to be mixed to said first gate means of said solid state first means; and
   signal source seventh means for supplying a second signal to be mixed to said second gate means of said solid state first means.

* * * * *